(12) United States Patent
Chang et al.

(10) Patent No.: US 11,676,850 B2
(45) Date of Patent: Jun. 13, 2023

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Chia-Chen Chang, Kaohsiung (TW); Yuan-Cheng Yang, Hsinchu (TW); Yun-Chi Wu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/333,878

(22) Filed: May 28, 2021

(65) Prior Publication Data
US 2022/0384247 A1 Dec. 1, 2022

(51) Int. Cl.
*H01L 21/762* (2006.01)
*H01L 21/768* (2006.01)

(52) U.S. Cl.
CPC .. *H01L 21/76224* (2013.01); *H01L 21/76205* (2013.01); *H01L 21/76877* (2013.01)

(58) Field of Classification Search
CPC ......... H01L 21/76224; H01L 21/76205; H01L 21/76877
See application file for complete search history.

(56) References Cited

U.S. PATENT DOCUMENTS

| 2004/0097019 A1* | 5/2004 | de Fresart | H01L 29/0642 257/E29.267 |
| 2020/0006550 A1* | 1/2020 | Todd | H01L 29/66659 |

FOREIGN PATENT DOCUMENTS

EP 1890335 A1 * 2/2008 ......... H01L 29/0619

OTHER PUBLICATIONS

U.S. Appl. No. 17/319,457 entitled "Semiconductor Device and Method for Manufacturing the Same", filed May 13, 2021.

* cited by examiner

*Primary Examiner* — Julia Slutsker
(74) *Attorney, Agent, or Firm* — WPAT Law; Anthony King

(57) ABSTRACT

A semiconductor device and method of manufacturing the same are provided. The semiconductor device includes a substrate and a first isolation structure which has a first corner. The semiconductor device also includes a first well region with a first conductive type. The semiconductor device includes further includes a gate structure over the first well region and covers a portion of the first corner of the first isolation structure. In addition, the semiconductor device includes a first doped region and a second doped region disposed on two opposites of the gate structure. Each of the first doped region and the second doped region has the first conductive type. The semiconductor device also includes a first counter-doped region in the first well region with a second conductive type different from the first conductive type. The first counter-doped region covers the first corner of the first isolation structure.

19 Claims, 17 Drawing Sheets

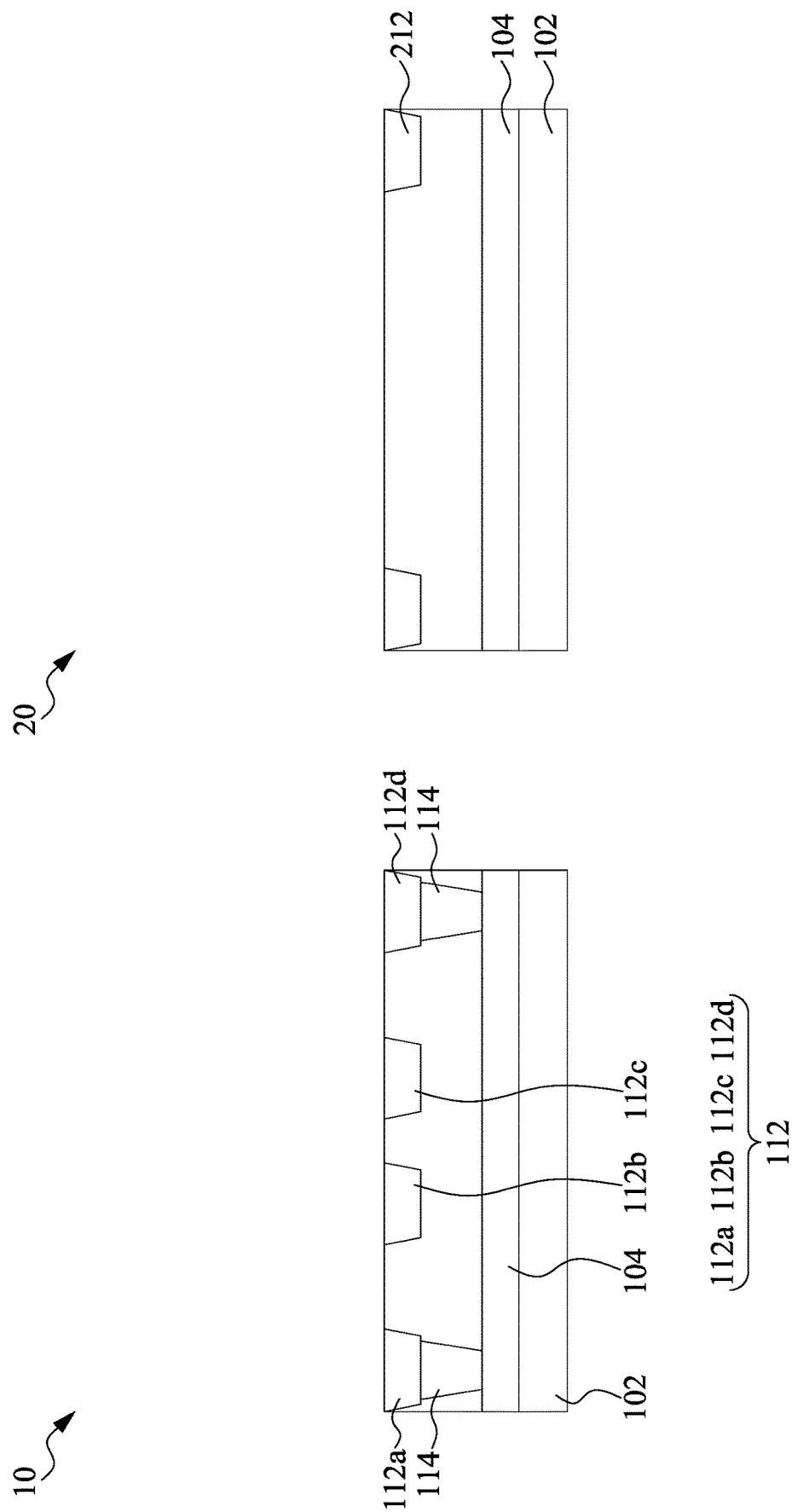

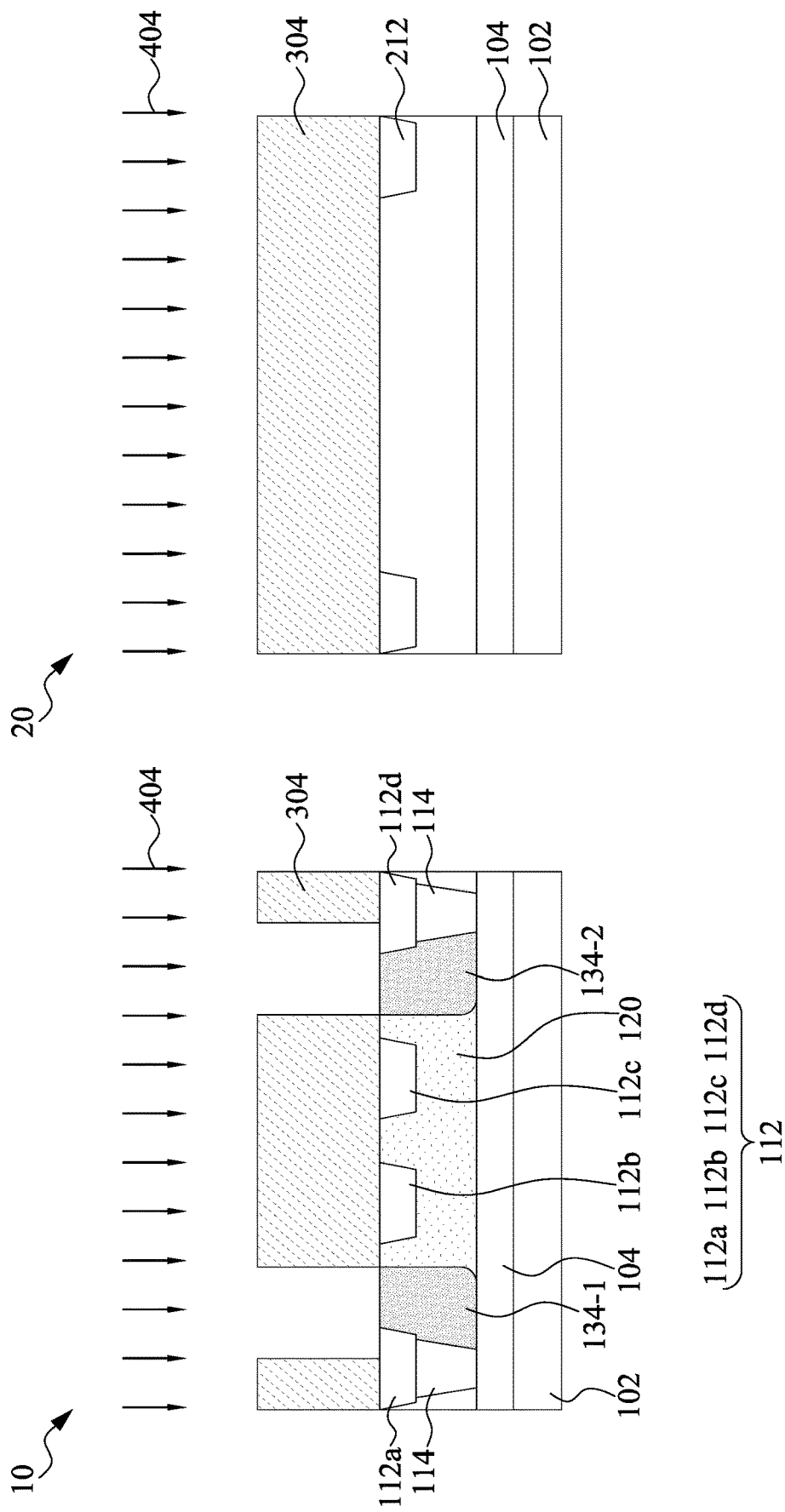

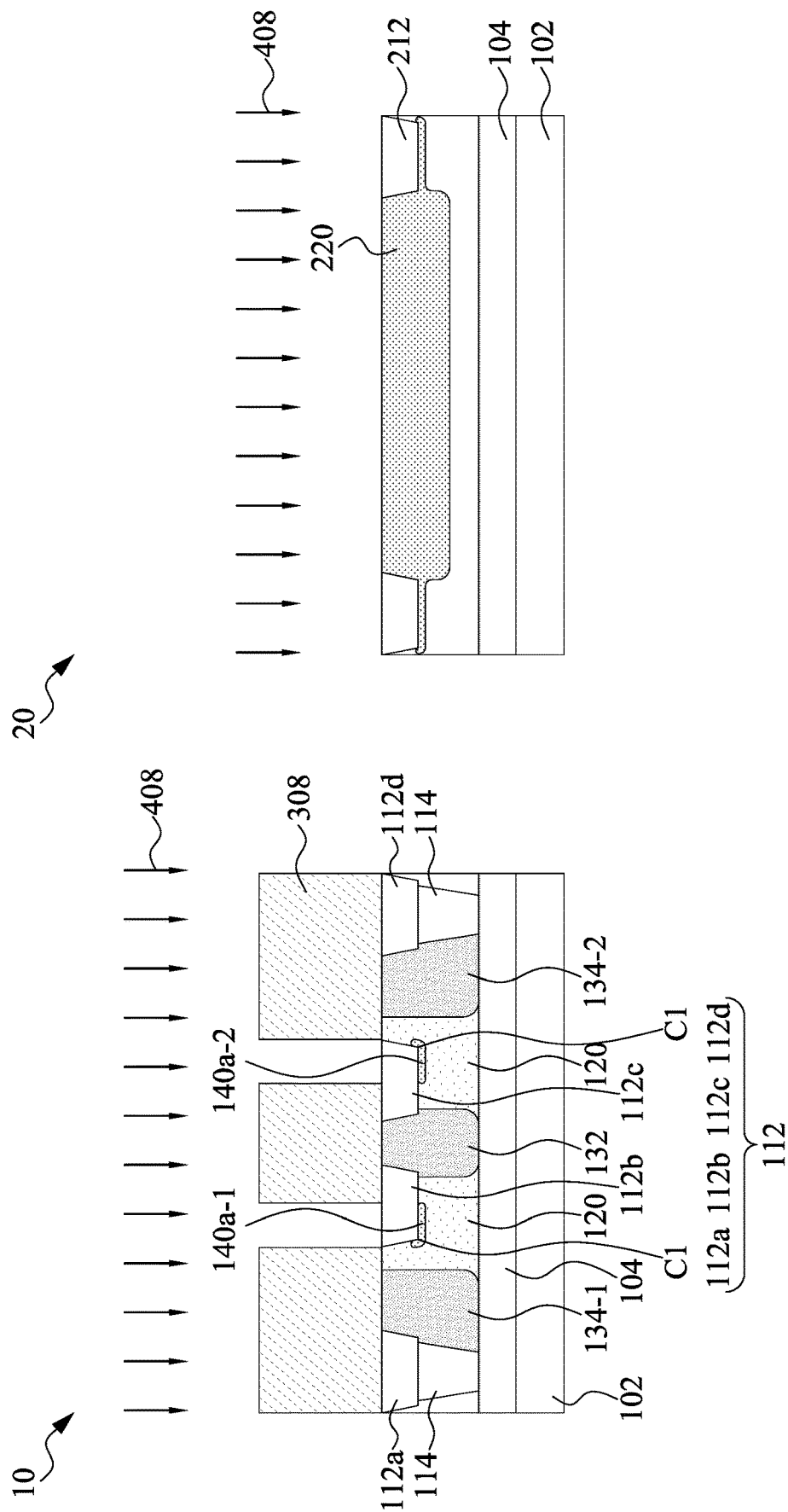

SEMICONDUCTOR DEVICE AND METHOD OF MANUFACTURING THE SAME

BACKGROUND

Technological advance in semiconductor integrated circuit (IC) materials, design, processing, and manufacturing have enabled the continual reduction in size of IC devices, where each generation has smaller and more complex circuits than the previous generation.

As semiconductor circuits composed of devices such as metal-oxide-semiconductor field-effect transistors (MOSFETs) are adapted for high voltage applications, such as high-voltage lateral diffusion metal-oxide-semiconductor (HV LDMOS) devices, problems arise with respect to decreasing voltage performance as the downscaling continues with advanced technologies. To prevent electron(s) impacting the interface between gate structure and the isolation structure, a new semiconductor device is required.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 8A, FIG. 9A, FIG. 10A, FIG. 11A, FIG. 12A, FIG. 13A and FIG. 14A as well as FIG. 8B, FIG. 9B, FIG. 10B, FIG. 11B, FIG. 12B, FIG. 13B and FIG. 14B illustrate various stages of manufacturing a semiconductor device, in accordance with some embodiments of the present disclosure.

DETAILED DESCRIPTION

Figure 1A:
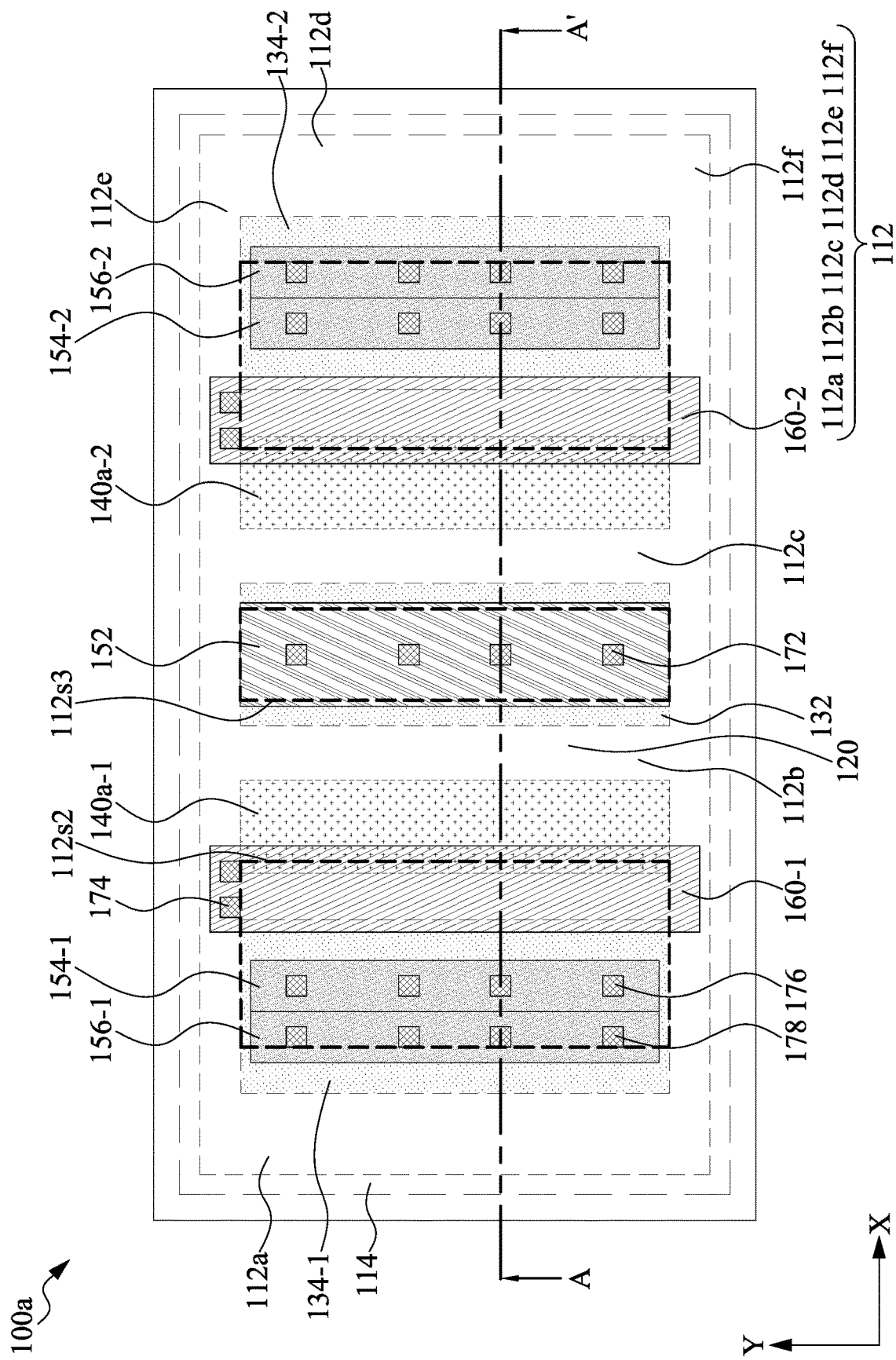
FIG. 1A illustrates a top view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some embodiments, semiconductor devices 100a-100f are provided, Each of the semiconductor devices 100-100f can be a high voltage semiconductor device. Each of the semiconductor devices 100a-100f can be an n type high-voltage device, but the disclosure is not limited thereto. In some embodiments, each of the semiconductor devices 100a-100f can be referred to as a high-voltage laterally-diffused MOS (HV LDMOS) transistor device, a high-voltage extended-drain MOS (HV EDMOS) transistor device, or any other HV device.

Figure 1B:
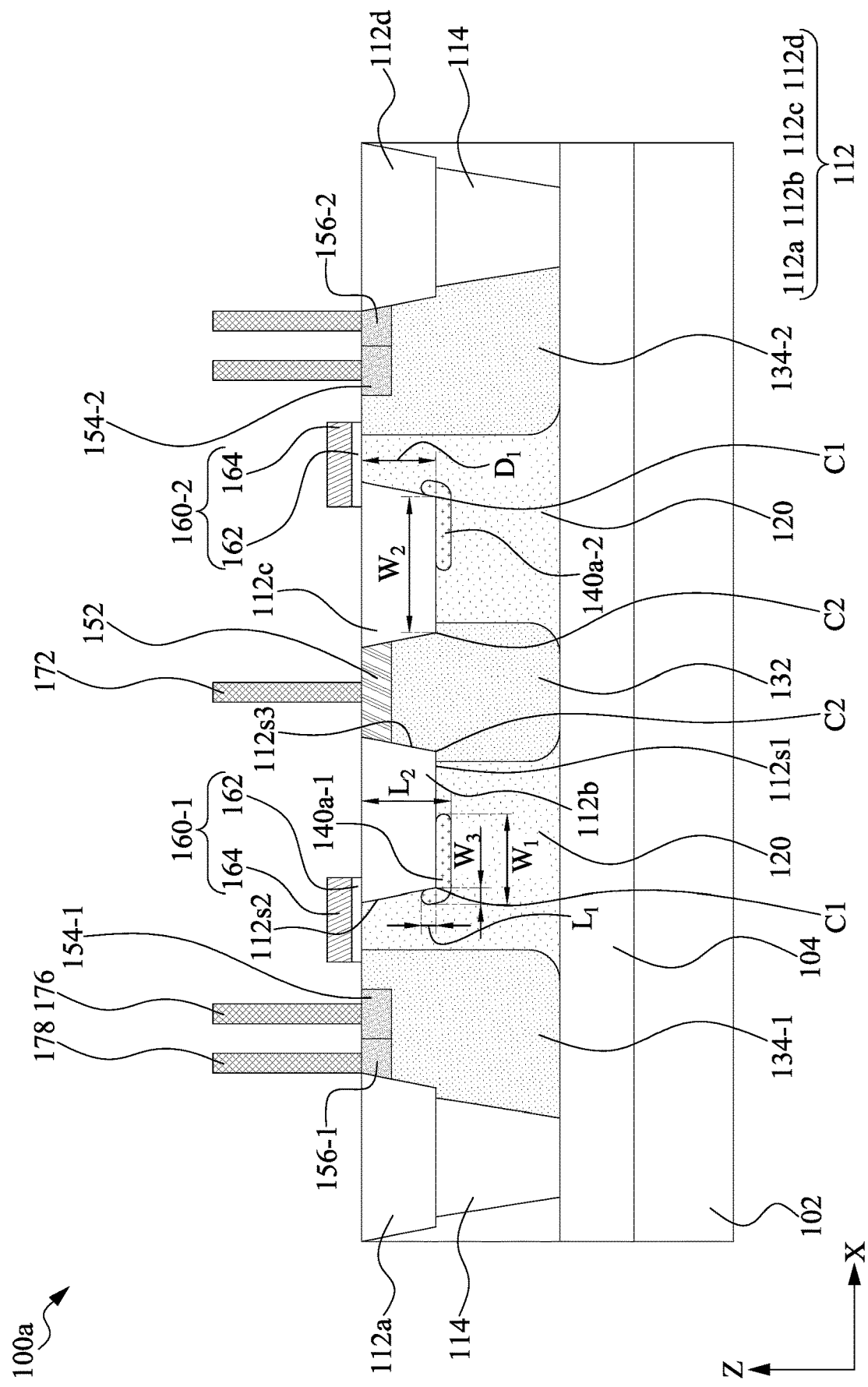
FIG. 1B illustrates a cross-sectional view along line A-A' of the semiconductor device shown in FIG. 1A, in accordance with sonic embodiments of the present disclosure.

Referring to FIGS. 1A and 1B, FIG. 1A illustrates a top view of the semiconductor device 100a, and FIG. 1B is a cross-sectional view taken along line A-A' of FIG. 1A.

In some embodiments, the semiconductor device 100a includes a substrate 102 (shown in FIG. 1B). The substrate 102 may be a semiconductor substrate, such as a bulk semiconductor, a semiconductor-on-insulator (SOI) substrate, or the like, which may be doped (e.g., with a p type or an n type dopant) or undoped. The substrate 102 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may a SiGe alloy with a gradient Ge feature in which the Si and Ge composition changes from one ratio at one location to another ratio at another location of the gradient SiGe feature. In another embodiment, the SiGe alloy is formed over a silicon substrate. In sonic embodiments, a SiGe alloy can be mechanically strained by another material in contact with the SiGe alloy. In some embodiments, the substrate 102 may have a multilayer structure, or the substrate 102 may include a multilayer compound semiconductor structure.

In sonic embodiments, the substrate 102 may include a dielectric layer 104 (shown in FIG. 1B). The dielectric layer 104 may be, for example, a buried oxide (BOX) layer, a silicon oxide layer, a doped epitaxial layer or the like. The insulator layer is provided on the substrate. Other substrates, such as a multi-layered or gradient substrate may also be used.

In some embodiments, the semiconductor device 100a includes an isolation structure 112. As shown in FIG. 1B, the isolation structure 112 is disposed in the substrate 102. In some embodiments, the isolation structure 112 can be a shallow trench isolation (STI), as shown in FIG. 1B, In other embodiments, the isolation dielectric layer 104 includes a structure of a local oxidization of silicon (LOCOS) structure, or any other suitable isolation structure.

As shown in FIG. 1A, the isolation structure 112 may include parts 112a, 112b, 112c, 112d, 112e and 112f. In sonic embodiments, each of the parts 112a, 112b, 112c and 112d extends along the Y direction. In some embodiments, each of the parts 112e and 112f extend along the X direction. The parts 112a, 112b, 112c and 112d are separated from each other. The parts 112e and 112f are separated from each other. In the top view shown in FIG. 1A, the isolation structure 112 may define a plurality of regions, and each of the regions is enclosed by the isolation structure 112. For example, one of the regions is defined by the parts 112a, 112b, 112e and 112f, one of the regions is defined by the parts 112b, 112c, 112e and 112f, and one of the regions is defined by the parts 112c, 112d, 112e and 112f.

In some embodiments, the semiconductor device 100a includes an isolation structure 114. As shown in FIG. 1B, the isolation structure 114 is disposed in the substrate 102. In some embodiments, the isolation structure 114 is disposed under the isolation structure 112. In some embodiments, the isolation structure 114 is disposed under and in contact with the part 112a and the part 112d. In some embodiments, the isolation structure 114 extends between the dielectric layer 104 and the isolation structure 112. In some embodiments, the isolation structure 114 can be a deep trench isolation (DTI). As shown in FIG. 1A, the isolation structure 114 may have a ring-shaped profile or other suitable profiles.

In some embodiments, the semiconductor device 100a includes a well region 120, In some embodiments, the well region 120 includes a first conductive type. In some embodiments, the first conductive type is an n type. In some embodiments, n type dopants include arsenic (As), phosphorus (P), other group V elements, or any combination thereof. In some embodiments, the first conductive type is a p type. In some embodiments, p type dopants include boron (B), other group III elements, or any combination thereof. The well region 120 can be referred to as a drift region. In some embodiments, the well region 120 can be referred to as a high-voltage n type well (HVNW) or high-voltage p type well (HVPW).

The semiconductor device 100a includes gate structures 160-1 and 160-2. The gate structures 160-1 and 160-2 are disposed on the substrate 102. As shown in FIG. 1A, each of the gate structures 160-1 and 160-2 extends along the Y direction. In some embodiments, as shown in FIG. 1B, the gate structures 160-1 and 160-2 cover a portion of the isolation structure 112. For example, the gate structure 160-1 covers a portion of the part 112b of the isolation structure 112, and the gate structure 160-2 covers the part 112c of the isolation structure 112. That is, each of the gate structures 160-1 and 160-2 overlaps the isolation structure 112 in the Z direction, which is substantially perpendicular to the X direction and the Y direction. In some embodiments, each of the parts 112b and 112c has a corner C1 and a corner C2 opposite to the corner C1, The corner C1 is defined by a bottom surface (or side) 112s1 and a lateral surface (or side) 112s2 of the isolation structure 112 collectively. The corner C2 is defined by the bottom surface 112s1 and a lateral surface 112s3 (or side) of the isolation structure 112 collectively. The corner C1 is more closer to the gate structure 160-1 or 160-2 than the corner C2 is. In some embodiments, the gate structure 160-1 covers the corner C1 of the part 112b of the isolation structure 112 in the Z direction, and the gate structure 160-1 is free from overlapping the corner C2 of the part 112b of the isolation structure 112 in the Z direction. The gate structure 160-1 is free from overlapping the parts 112a, 112c and 112d. In some embodiments, the gate structure 160-2 covers the corner C1 of the part 112c of the isolation structure 112 in the Z direction, and the gate structure 160-2 is free from overlapping the corner C2 of the part 112c of the isolation structure 112 in the Z direction.

Each of the gate structures 160-1 and 160-2 includes a gate dielectric 162 and a gate electrode 164. The gate dielectric 162 can have a single layer or a multi-layer structure. In some embodiments, the gate dielectric 162 is a multi-layer structure that includes an interfacial layer and a high-k (dielectric constant greater than 4) dielectric layer. The interfacial layer can include dielectric material such as silicon oxide, silicon nitride, silicon oxynitride, other dielectric material, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

The gate electrode 164 is disposed on the gate dielectric 162. The gate electrode 164 can include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, the gate electrode 164 includes a work function metal layer that provides a metal gate with an n type-metal work function or p type-metal work function. The p type-metal work function materials include materials such as ruthenium, palladium, platinum, cobalt, nickel, conductive metal oxide, or other suitable materials. The n type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

The semiconductor device 100a includes doped regions 152, 154-1 and 154-2. As shown in FIG. 1A, each of the doped regions 152, 154-1 and 154-2 is disposed in the substrate 102. Each of the doped regions 152, 154-1 and 154-2 extends along the Y direction. The doped regions 152 and 154-1 are disposed on two opposites of the gate structure 160-1. The doped regions 152 and 154-2 are disposed on two opposites of the gate structure 160-2. The doped region 152 is disposed between the gate structures 160-1 and 160-2. In some embodiments, the doped region 152 is disposed between the parts 112b and 112c. The doped region 152 is separated from the gate structure 160-1 by the part 112b of the isolation structure 112. The doped region 152 is separated from the gate structure 160-2 by the part 112c of the isolation structure 112. The side surfaces of the doped region 152 may be in contact with the parts 112b and 112c of the isolation structure 112, and a bottom surface of the doped region 152 is in contact with the doped region 132. The doped region 152 includes the first conductive type, such as n type. Each of the doped regions 154-1 and 154-2 has the first conductive type, such as n type. In some embodiments, the doped region 152 is a drain region, and each of the doped regions 154-1 and 154-2 is a source region.

The semiconductor device 100a includes a doped region 132. As shown in FIG. 1A, the doped region 132 extends along the Y direction. In some embodiments, the doped region 132 is disposed under the doped region 152. Further, the doped region 132 extends between the doped region 152 and the dielectric layer 104. The doped region 132 may be in contact with the dielectric layer 104. The doped region 132 includes the first conductive type. A doping concentration of the doped region 152 is greater than a doping concentration of the doped region 132.

The semiconductor device 100a includes doped regions 134-1 and 134-2. As shown in FIG. 1A, each of the doped regions 134-1 and 134-2 extends along the Y direction. The doped regions 134-1 and the 134-2 are surrounded by the isolation structure 114. The doped region 134-1 is disposed under the doped region 154-1. The doped region 134-2 is disposed under the doped region 154-2. The well region 120 is disposed between the doped region 134-1 and the doped region 132. The well region 120 is disposed between the doped region 134-2 and the doped region 132, The gate structure 160-1 may partially cover the doped region 134-1. The gate structure 160-2 may partially cover the doped region 134-2. Each of the doped regions 134-1 and 134-2 includes a second conductive type different from the first conductive type. The second conductive type and the first conductive type are complementary to each other. A doping concentration of the doped region 134-1 is less than a doping concentration of the doped region 154-1. In some embodiments, the doping concentration of the doped region 134-1 or 134-2 may range from about $2.5E+15/cm^3$ to about $3.5E+18/cm^3$, but the disclosure is not limited thereto. In some embodiments, a side edge of the doped region 134-1 or 134-2 can be in contact with the well region 120.

The semiconductor device 100a includes doped regions 156-1 and 156-2. As shown in FIG. 1A, each of the doped regions 156-1 and 156-2 extends along the Y direction. The doped region 156-1 is disposed in the doped region 134-1 and adjacent to the doped region 154-1. The doped region 156-2 is disposed in the doped region 134-2 and adjacent to the doped region 154-2. Each of the doped regions 156-1 and 156-2 includes the second conductive type. In some embodiments, each of the doped regions 156-1 and 156-2 serves as a body pickup region.

Additionally, silicide structures (not shown) can be formed on the doped regions 152, 154-1, 154-2, 156-1 and 156-2, respectively. The silicide structure may include materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridin silicide (TrSi), erbium silicide (ErSi), cobalt silicide (CoSi), other suitable materials, or a combination thereof.

In some embodiments, the semiconductor device 100a includes counter-doped regions 140a-1 and 140-2. In some embodiments, each of the counter-doped regions 140a-1 and 140a-2 includes the second conductive type, such as p type. Each of the counter-doped regions 140a-1 and 140a-2 is disposed in the well region 120. As shown in FIG. 1A, each of the counter-doped regions 140a-1 and 140a-2 extends along the Y direction. In some embodiments, each of the counter-doped regions 140a-1 and 140a-2 is proximal to one of the corners of the isolation structure 112. For example, the counter-doped region 140a-1 is proximal to the corner C1 of the part 112b of the isolation structure 112. In some embodiments, each of the counter-doped regions 140a-1 and 140a-2 covers one of the corners of the isolation structure 112. For example, the counter-doped region 140a-1 covers the corner C1 of the part 112b, and the counter-doped region 140a-1 is free from covering the corner C2 of the part 112b. A portion of the counter-doped region 140a-1 is disposed between the doped region 152 and the gate structure 160-1. A portion of the counter-doped region 140a-2 is disposed between the doped region 152 and the gate structure 160-2. In some embodiments, the counter-doped region 140a-1 may cover either the bottom surface 112s1, the lateral surface 112s2 or both of the isolation structure 112. As shown in FIG. 1B, the counter-doped region 140a-1 covers the bottom surface 112s1 and the lateral surface 112s2 of the part 112b of the isolation structure 112. In some embodiments, each of the counter-doped regions 140a-1 and 140a-2 is in contact with one of corners of the isolation structure 112. For example, the counter-doped region 140a-1 is in contact with the corner C1 of the part 112b of the isolation structure 112, and the counter-doped region 140a-1 is separated from the corner C2 of the part 112b of the isolation structure 112. In some embodiments, the corner C1 of the part 112b of the isolation structure 112 is enclosed or surrounded by the counter-doped region 140a-1. In some embodiments, the corner C1 of the part 112b of the isolation structure 112 is separated from the well region 120 by the counter-doped region 140a-1. In some embodiments, a portion of the counter-doped region 140a-1 is free from vertically overlapping the gate structure 160-1. As shown in FIGS. 1A and 1B, each of the gate structure 160-1, the part 112b of the isolation structure 112 and the counter-doped region 140a-1 vertically overlaps with each other in the Z direction. That is, the gate structure 160-1, the part 112b of the isolation structure 112 and the counter-doped region 140a-1 are partially aligned to each other in the Z direction. In some embodiments, each of the counter-doped regions 140a-1 and 140a-2 is separated from the doped region 132. In some embodiments, the dopant(s) of the counter-doped regions 140a-1 and 140a-2 includes B, BF, or other suitable dopants.

Each of the counter-doped regions 140a-1 and 140a-2 is configured to prevent electrons impacting the corner (e.g., the corner C1) of the isolation structure (e.g., the part 112b of the isolation structure 112). When a high voltage semiconductor device operates, a relatively great voltage stress occurs between the gate structure and the corner, which is proximal to the gate structure, of the isolation structure. As a result, electron(s) may have a relatively great possibility to impact this corner of the isolation structure, resulting in hot carrier injection (HCI). In this embodiment, the counter-doped region (e.g., the counter-doped regions 140a-1 and 140a-2) has the conductive type different from the well region (e.g., the well region 120) and covers the corner (e.g., the corner C1) of the isolation structure 112. Therefore, electron(s) may be expelled from the corner of the isolation structure by the counter-doped region, reducing the HCI.

In some embodiments, the doping concentration of the counter-doped region 140a-1 is less than that of the doped region 152. In some embodiments, the concentration of each of the counter-doped regions 140a-1 and 140a-2 has a uniform distribution. In some embodiments, the concentration of each of the counter-doped regions 140a-1 and 140a-2 has a non-uniform distribution. For example, the concentration of each of the counter-doped regions 140a-1 and 140a-2 has a Gaussian distribution or a gradient distribution. In some embodiments, each of the counter-doped regions 140a-1 and 140a-2 has a less concentration closer to the corner C1, and a greater concentration far from the corner C2, which may assist in expelling electron(s) from impacting the corner C1.

In some embodiments, the ratio between the width $W_1$ of the counter-doped region 140a-1 and the width $W_2$ of the bottom surface 112s1 of the part 112b ranges from about 0.3 to about 0.8, such as 0.3, 0.4, 0.5, 0.6, 0.7 or 0.8. In some embodiments, the ratio between the width $W_3$ of the counter-doped region 140a-1, which is defined as a width exceeding the corner C1 in the X direction, and the width $W_2$ of the bottom surface 112s1 of the part 112b ranges from about 0.1 to about 0.4, such as 0.1, 0.2, 0.3 or 0.4. In some embodiments, the ratio between the length Li of the counter-doped region 140a-1 that over the bottom surface 112s1 of the isolation structure 112 and the length of the part 112b ranges from about 0.1 to about 0.5, such as 0.1, 0.2, 0.3, 0.4 or 0.5. When the width $W_1$, width $W_3$, and length Li of the counter-doped region 140a-1 is within above range, the HCI can be reduced without impacting the performance of the semiconductor device 100a.

The semiconductor device 100a includes electrical connectors 172, 174, 176 and 178. The electrical connectors 172 are disposed over the doped region 152. The electrical connector 172 are electrically connected to the doped region 152. Each of the electrical connectors 174 (shown in FIG. 1A) is disposed over the gate structure 160-1 or the gate structure 160-2. Each of the electrical connectors 174 is electrically connected to the gate structure 160-1 or the gate structure 160-2. Each of the electrical connectors 176 is disposed over the doped region 154-1 or the doped region 154-2. Each of the electrical connectors 176 is electrically connected to the doped region 154-1 or 154-2. Each of the electrical connectors 178 is disposed over the doped region 156-1 or the doped region 156-2. Each of the electrical connectors 178 is electrically connected to the doped region 156-1 or 156-2. As shown in FIG. 1A, the electrical connectors 172, 176 and 178 can be aligned to each other in the X direction. The electrical connector 174 can be free from overlapping the electrical connector 172, the electrical connector 176 and the electrical connector 178 in the X direction, but the disclosure is not limited thereto.

Figure 2A:
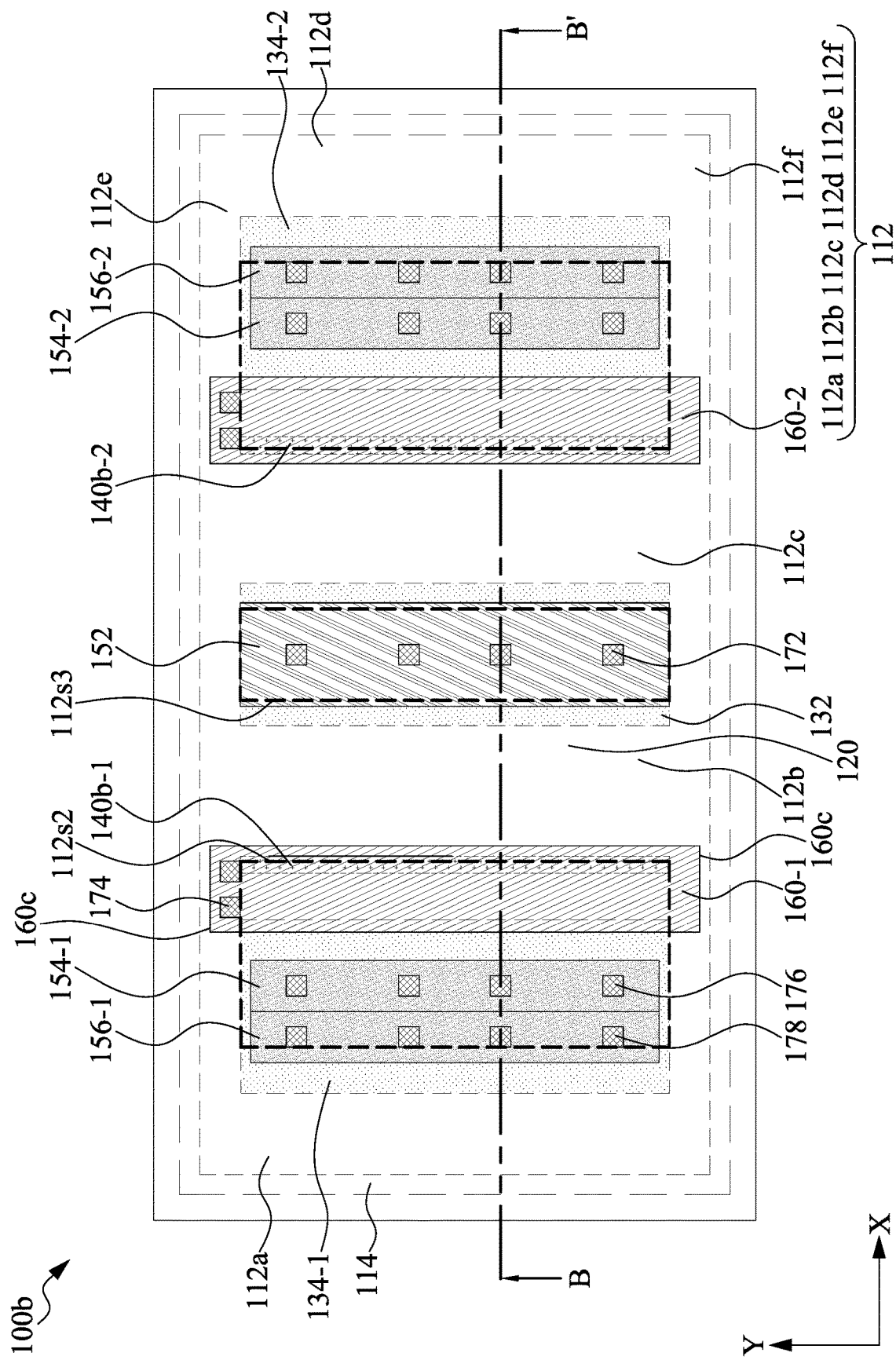
FIG. 2A illustrates a top view of a semiconductor device, in accordance with some embodiments of the present disclosure.
Figure 2B:
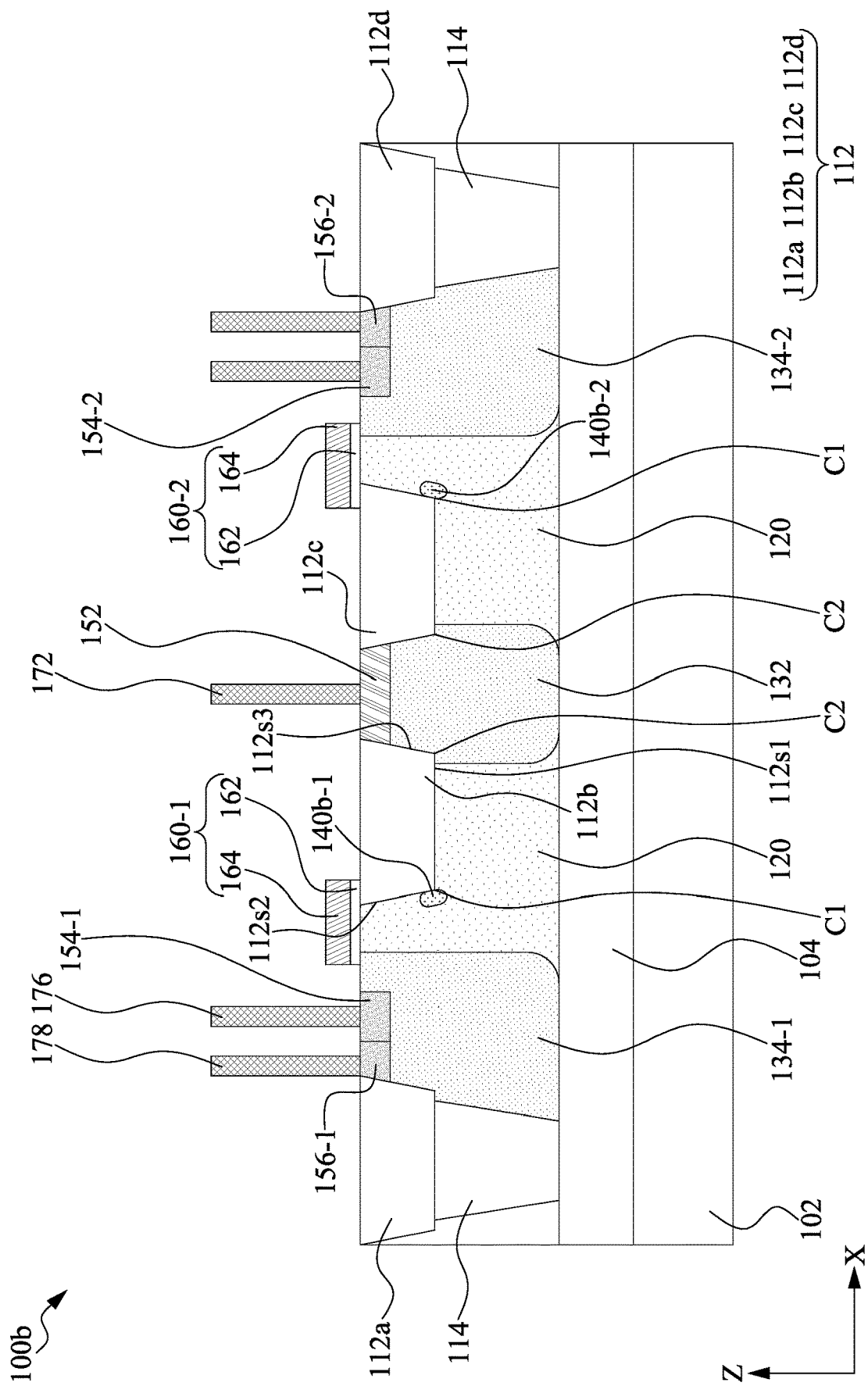
FIG. 2B illustrates a cross-sectional view along line B-B' of the semiconductor device shown in FIG. 2A, in accordance with some embodiments of the present disclosure.

Referring to FIGS. 2A and 2B, FIG. 2A illustrates a top view of the semiconductor device 100b, and FIG. 2B is a cross-sectional view taken along line B-B' of FIG. 2A.

In some embodiments, the semiconductor device 100b has a structure similar to that of the semiconductor device 100a, and one of the differences between them is that the semiconductor device 100b includes counter-doped regions 140b-1 and 140b-2.

As shown in the top view of FIG. 2A, the counter-doped region 140b-1 is disposed within the boundary 160c of the gate structure 160-1. That is, the counter-doped region 140-1 is completely covered by the gate structure 160-1. In some embodiments, the counter-doped region 140b-1 is enclosed by the boundary 160c of the gate structure 160-1 from the top view. As shown in FIG. 2B, the counter-doped region 140b-1 is proximal to and covers the corner C1 of the part 112b of the isolation structure 112. In some embodiments, the counter-doped region 140b-1 is in contact with the lateral surface 112s2 of the isolation structure 112. In some embodiments, the counter-doped region 140b-1 is substantially separated from the bottom surface 112s1 of the isolation structure 112. In this embodiment, electron(s) can be expelled from the corner C1 of the isolation structure 112 by the counter-doped regions 140b-1 and 140b-2, thereby reducing the HCI.

Figure 3:
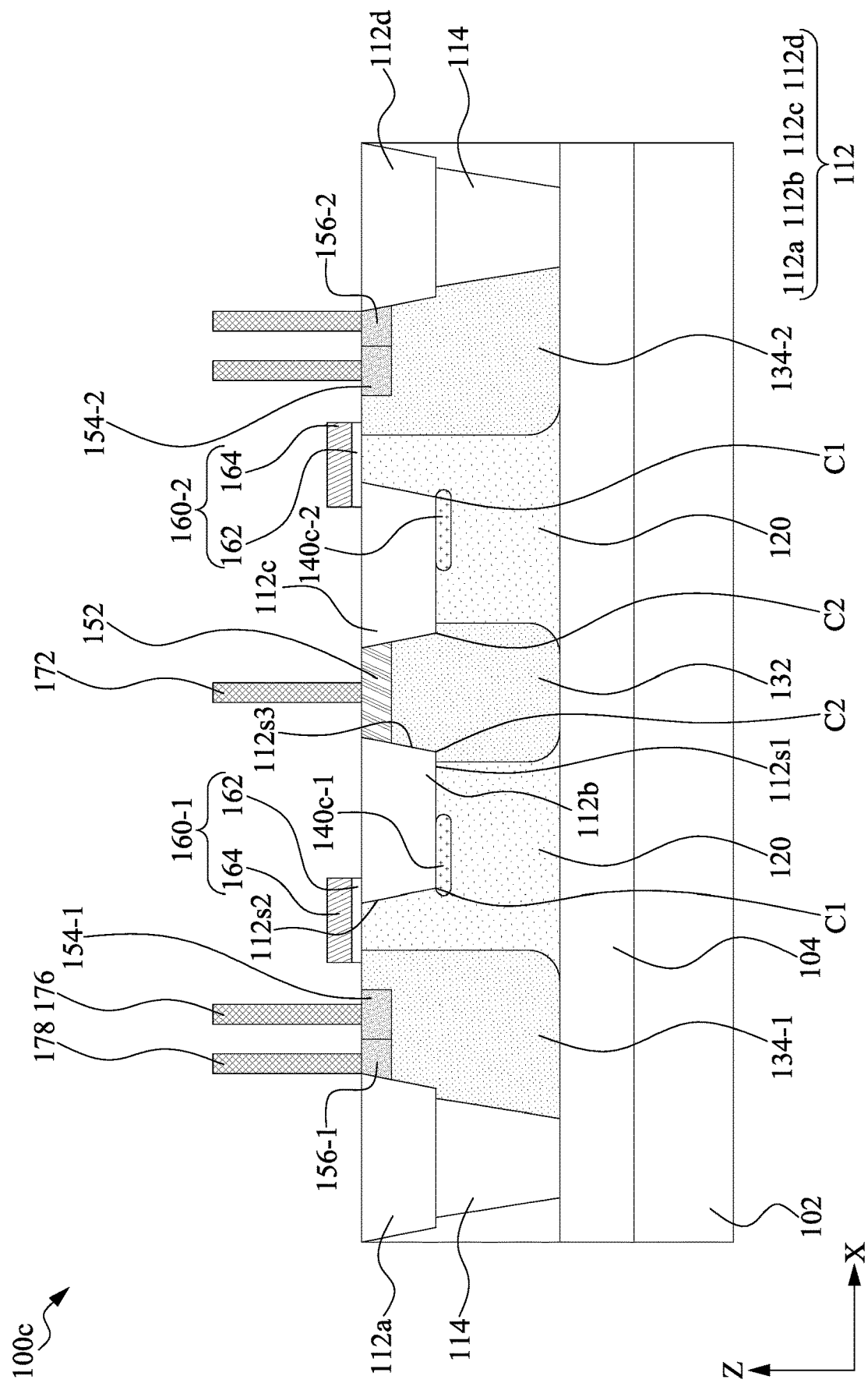
FIG. 3 illustrates a cross-sectional view of a semiconductor device, in accordance with some embodiments of the present disclosure.

FIG. 3 illustrates a cross-sectional view of the semiconductor device 100c, in accordance with some embodiments of the present disclosure.

In some embodiments, the semiconductor device 100c has a structure similar to that of the semiconductor device 100a, and one of the differences between them is that the semiconductor device 100c includes counter-doped regions 140c-1 and 140c-2.

As shown in FIG. 3, each of the counter-doped regions 140c-1 and 140c-2 is disposed under the isolation structure 112. For example, the counter-doped region 140c-1 is disposed under the bottom surface 112s1 of the part 112b of the isolation structure 112. In some embodiments, the counter-doped region 140c-1 is free from laterally, or along the X direction, overlapping the isolation structure 112. In some embodiments, the counter-doped region 140c-1 is in contact with the bottom surface 112s1 of the isolation structure 112. In some embodiments, the counter-doped region 140c-1 is substantially separated from the lateral surface 112s2 of the isolation structure 112. In this embodiment, electron(s) can be expelled from the corner C1 of the isolation structure 112 by the counter-doped regions 140b-1 and 140b-2, thereby reducing the HCI.

Figure 4:
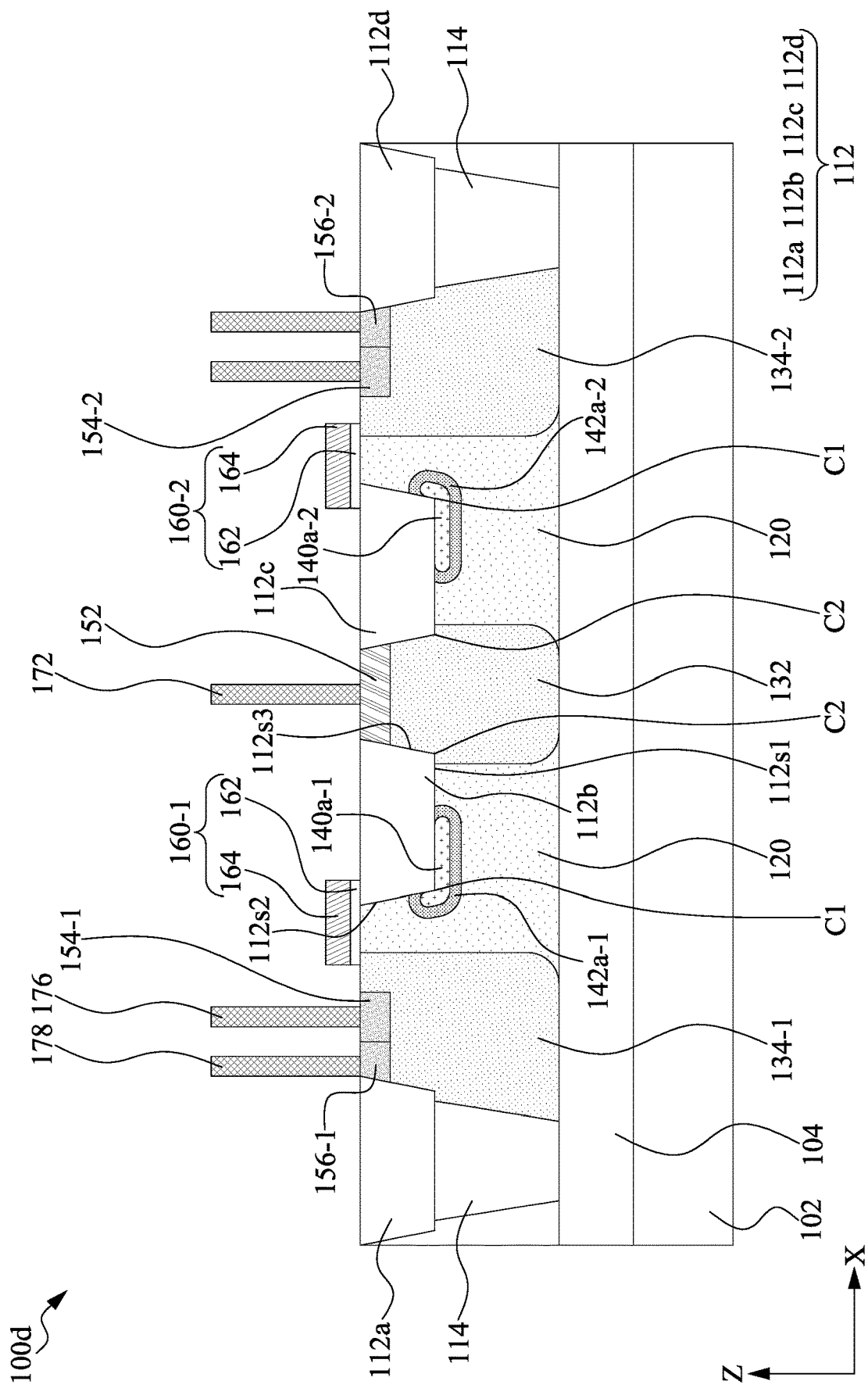
FIG. 4 illustrates a cross-sectional view of a semiconductor device, in accordance with some embodiments of the present disclosure.

FIG. 4 illustrates a cross-sectional view of the semiconductor device 100d, in accordance with some embodiments of the present disclosure.

In some embodiments, the semiconductor device 100d has a structure similar to that of the semiconductor device 100a, and one of the differences between them is that the semiconductor device 100d further includes counter-doped regions 142a-1 and 142a-2.

In some embodiments, each of the counter-doped regions 142a-1 and 142a-2 includes the second conductive type, such as p type. Each of the counter-doped regions 142a-1 and 142a-2 is disposed in the well region 120. In some embodiments, each of the counter-doped regions 142a-1 and 142a-2 is proximal to one of the corners of the isolation structure 112. For example, the counter-doped region 142a-1 is proximal to the corner C1 of the part 112b of the isolation structure 112. In some embodiments, each of the counter-doped regions 142a-1 and 142a-2 covers one of the corners of the isolation structure 112. For example, the counter-doped region 142a-1 covers the corner C1 of the part 112b of the isolation structure 112, and the counter-doped region 142a-1 is free from covering the corner C2 of the part 112b of the isolation structure 112. A portion of the counter-doped region 142a-1 is disposed between the doped region 152 and the gate structure 160-1. A portion of the counter-doped region 142a-2 is disposed between the doped region 152 and the gate structure 160-2. In some embodiments, the counter-doped region 142a-1 may cover either the bottom surface 112s1, the lateral surface 112s2 or both. As shown in FIG. 4, the counter-doped region 142a-1 covers the bottom surface 112s1 and the lateral surface 112s2 of the part 112b of the isolation structure 112. In some embodiments, the counter-doped region 142a-1 is separated from the corners C1 and C2 of the part 112b of the isolation structure 112. In some embodiments, the counter-doped region 142a-1 is in contact with the bottom surface 112s1 and the lateral surface 112s2 of the isolation structure 112. In some embodiments, the corner C1 of the part 112b is enclosed or surrounded by the counter-doped region 142a-1. In some embodiments, the corner C1 of the part 112b of the isolation structure 112 is separated from the well region 120 by the counter-doped regions 140a-1 and 142a-1. In some embodiments, a portion of the counter-doped region 142a-1 is free from vertically overlapping the gate structure 160-1. As shown in FIG. 4, each of the gate structure 160-1, the part 112b of the isolation structure 112, the counter-doped regions 140a-1 and 142a-1 at least partially vertically overlaps with each other. That is, the gate structure 160-1, the part 112b of the isolation structure 112, the counter-doped regions 140a-1 and 142a-1 are partially aligned to each other in the Z direction. In some embodiments, each of the counter-doped regions 142a-1 and 142a-2 is separated from the doped region 132. In some embodiments, each of the counter-doped regions 140a-1 and 140a-2 is separated from the well region 120. For example, the counter-doped region 140a-1 is separated from the well region 120 by the counter-doped region 142a-1. In some embodiments, the counter-doped region 140a-1 is partially surrounded by the counter-doped region 140a-2.

In some embodiments, the doping concentration of the counter-doped region 142a-1 is different from the counter-doped region 140a-1. For example, a doping concentration of the counter-doped region 142a-1 is greater than that of the counter-doped region 140a-1. In some embodiments, the dopant of the counter-doped region 142a-1 is different from that of the counter-doped region 140a-1. In some embodiments, the dopant of the counter-doped region 142a-1 is the same as that of the counter-doped region 140a-1.

Each of the counter-doped regions 142a-1 and 142a-2 is configured to prevent electrons impacting the corner (e.g., the corner C1) of the isolation structure (e.g., the part 112b of the isolation structure 112). In this embodiment, since each of the counter-doped regions 142a-1 and 142a-2 covers the corner of the isolation structure, the HCI may further be reduced.

Figure 5:
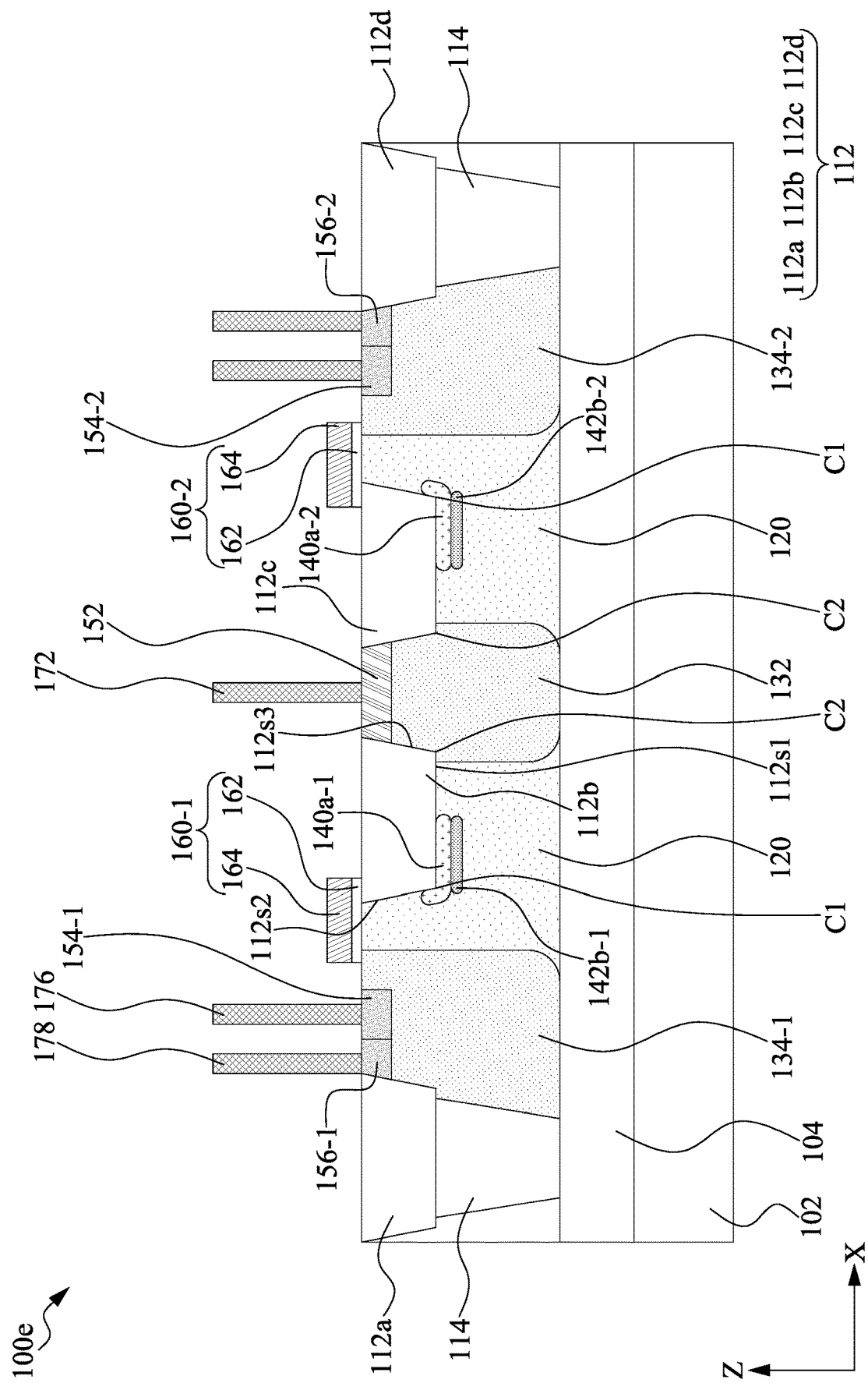
FIG. 5 illustrates a cross-sectional view of a semiconductor device, in accordance with some embodiments of the present disclosure.

FIG. 5 illustrates a cross-sectional view of the semiconductor device 100e, in accordance with some embodiments of the present disclosure.

In some embodiments, the semiconductor device 100e has a structure similar to that of the semiconductor device 100a, and one of the differences between them is that the semiconductor device 100e includes counter-doped regions 142b-1 and 142b-2.

In some embodiments, the counter-doped region 142b-1 is disposed under the counter-doped region 140a-1. In some embodiments, the counter-doped region 142b-2 is disposed under the counter-doped region 140a-2. In some embodiments, a portion of the counter-doped region 142b-1 is in contact with the lower surface (or boundary) of the counter-doped region 140a-1. In some embodiments, a portion of the counter-doped region 140a-1 is separated from the well region 120 by the counter-doped region 142b-1, and a portion of the counter-doped region 140a-1 is in contact with the well region 120. In some embodiments, the counter-doped region 142b-1 is separated from the part 112b of the isolation structure 112. Since the counter-doped regions 142b-1 and 142b-2 may further protect the corner (e.g., the corner C1) of the isolation structure (e.g., the part 112b of the isolation structure 112), the HCI may further be reduced.

Figure 6:
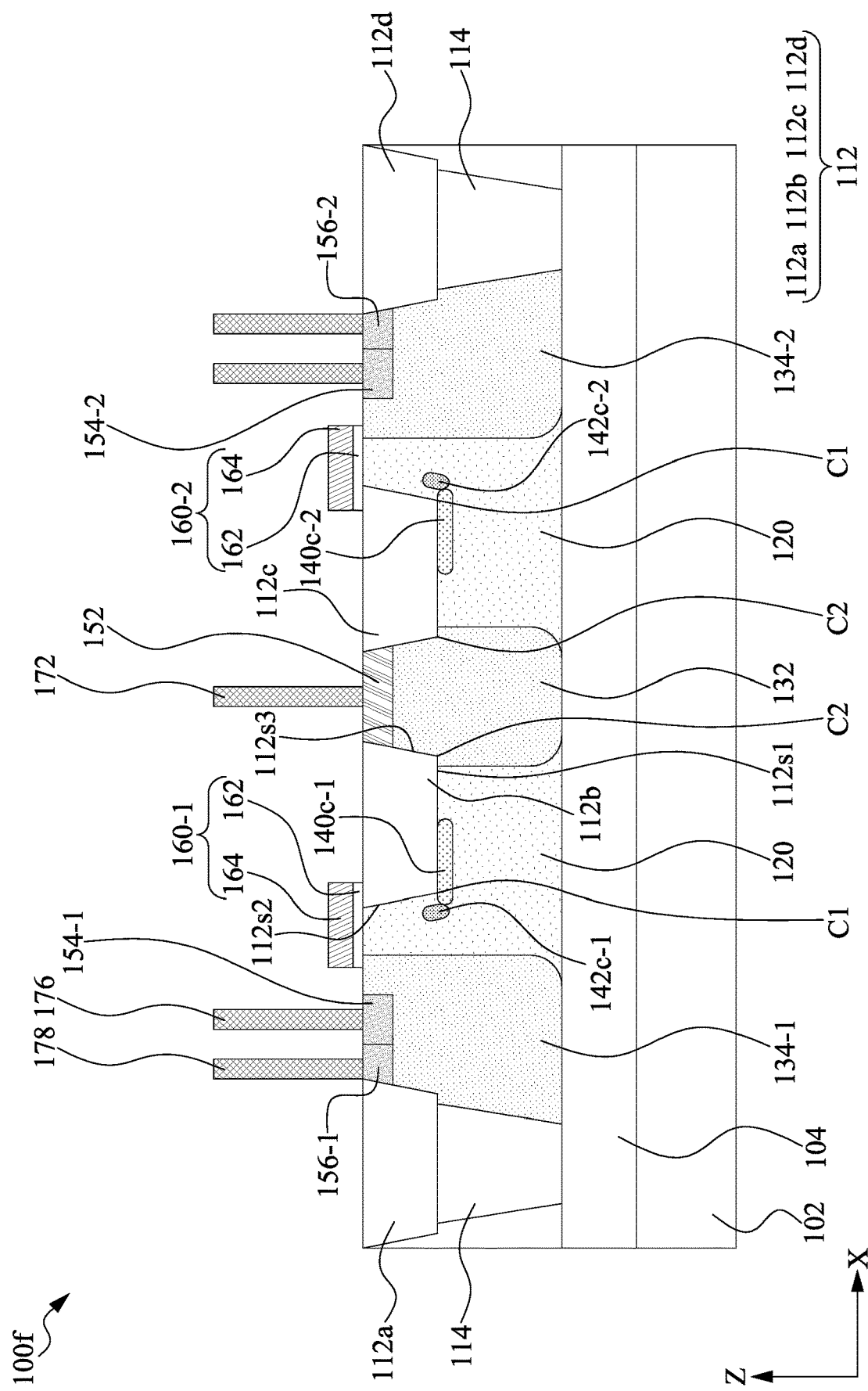
FIG. 6 illustrates a cross-sectional view of a semiconductor device, in accordance with some embodiments of the present disclosure.

FIG. 6 illustrates a cross-sectional view of the semiconductor device 100f, in accordance with some embodiments of the present disclosure.

In some embodiments, the semiconductor device 100f has a structure similar to that of the semiconductor device 100c, and one of the differences between them is that the semiconductor device 10f includes counter-doped regions 142c-1 and 142c-2.

In some embodiments, each of the counter-doped regions 142c-1 and 142c-2 is laterally, or along the X direction, overlapping the isolation structure 112. In some embodiments, the counter-doped region 142c-1 is separated from the lateral surface 112s2 of the isolation structure 112. The counter-doped region 142c-1 is substantially free from overlapping the bottom surface 112s1 of the isolation structure 112. The counter-doped regions 140c-1 and 142c-1 may cover or enclose the corner C1 of the part 112b of the isolation structure 112. Since the counter-doped regions 142c-1 and 142c-2 may further protect the corner (e.g., the corner C1 of the isolation structure (e.g., the part 112b of the isolation structure 112), the HCI may further be reduced.

Figure 7:
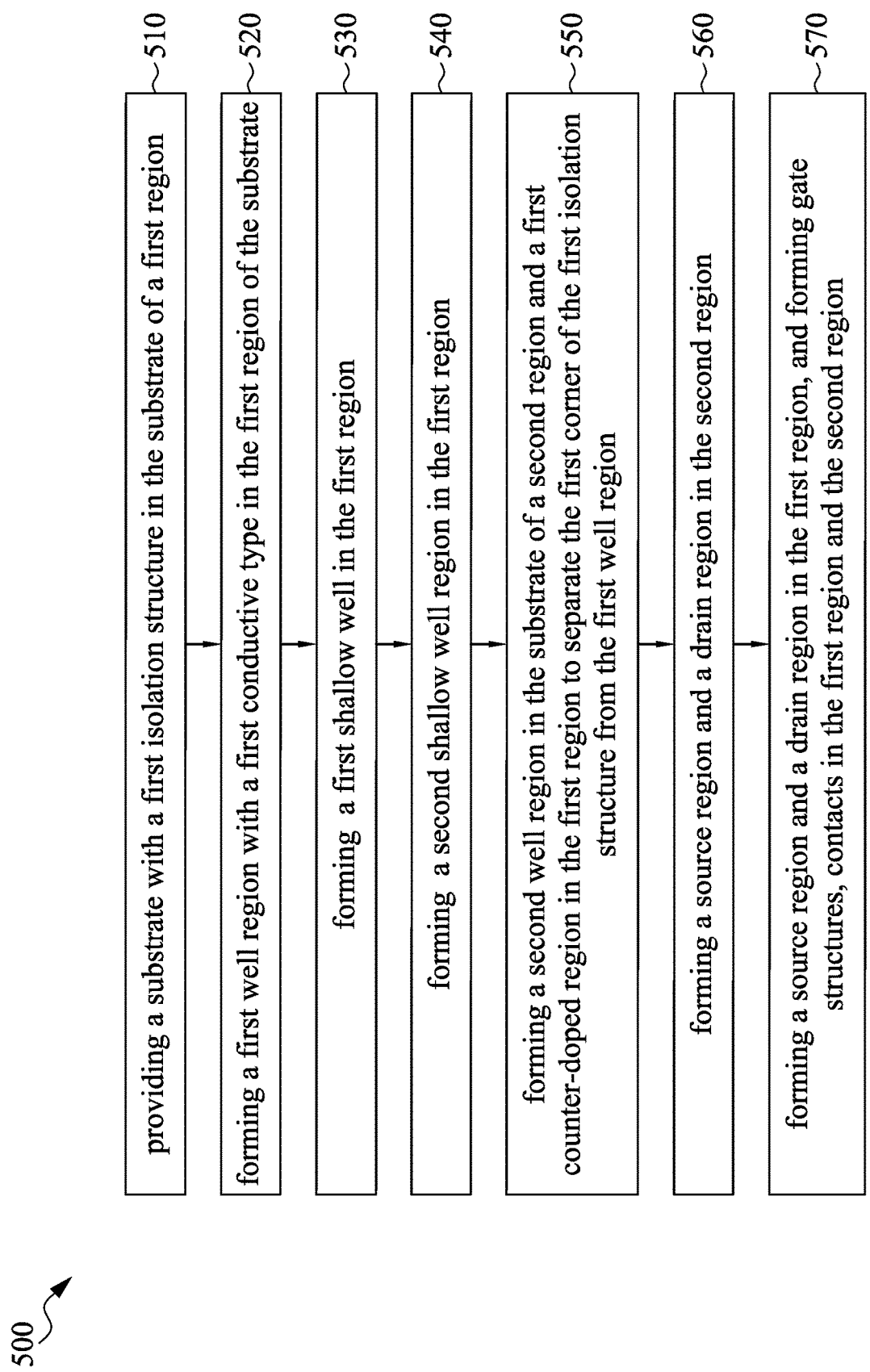
FIG. 7 is a flow chart illustrating a method for manufacturing a semiconductor device according to various aspects of the present disclosure.

FIG. 7 is a flow chart illustrating a method 500 for manufacturing a semiconductor device according to various aspects of the present disclosure. The semiconductor device includes a first region and a second region. The method 500 begins with operation 510 in which a substrate is provided with a first isolation structure in the substrate of the first region. The method 500 continues with operation 520 in which a first well region with a first conductive type is formed in the first region of the substrate. The method 500 continues with operation 530 in which a first shallow well is formed in the first region. The method 500 continues with operation 540 in which a second shallow well region is formed in the first region. The method 500 continues with operation 550 in which a second well region is formed in the substrate of a second region, and a first counter-doped region is formed in the first region to separate the first corner of the first isolation structure from the first well region. The method 500 continues with operation 560 in which a source region and a drain region are formed in the second region. The method 500 continues with operation 570 in which a source region and a drain region are formed in the first region, and gate structures, contacts are formed in the first region and the second region.

The method 500 is merely an example, and is not intended to limit the present disclosure beyond what is explicitly recited in the claims. Additional operations can be provided before, during, and after the method 500, and some operations described can be replaced, eliminated, or moved around for additional embodiments of the method.

FIG. 8A, FIG. 9A, FIG. 10A, FIG. 11A, FIG. 12A, FIG. 13A and FIG. 14A as well as FIG. 8B, FIG. 9B, FIG. 10B, FIG. 11B, FIG. 12B, FIG. 13B and FIG. 14B illustrate various stages of manufacturing a semiconductor device 1, in accordance with some embodiments of the present disclosure. FIG. 8A, FIG. 9A, FIG. 10A, FIG. 11A, FIG. 12A, FIG. 13A and FIG. 14A illustrate the stages of region 10, and FIG. 8B, FIG. 9B, FIG. 10B, FIG. 11B, FIG. 12B, FIG. 13B and FIG. 14B illustrate the stages of region 20.

In some embodiments, the semiconductor device 1 includes the region 10 and the region 20. In some embodiments, the region 10 is a high voltage region or other regions. In some embodiments, the region 20 is an input/output (IO) region, core region or other regions.

As shown in FIGS. 8A and 8B, a substrate 102 is provided. A dielectric layer 104 is formed. Isolation structure 112, including parts 112a, 112b, 112c and 112d, are formed in the substrate 102 of the region 10. An isolation structure 114 is formed under the part 112a and the part 112d of the isolation structure 112. Isolation structures 212 are formed in the substrate 102 of the region 20.

Figures 9A, 9B:
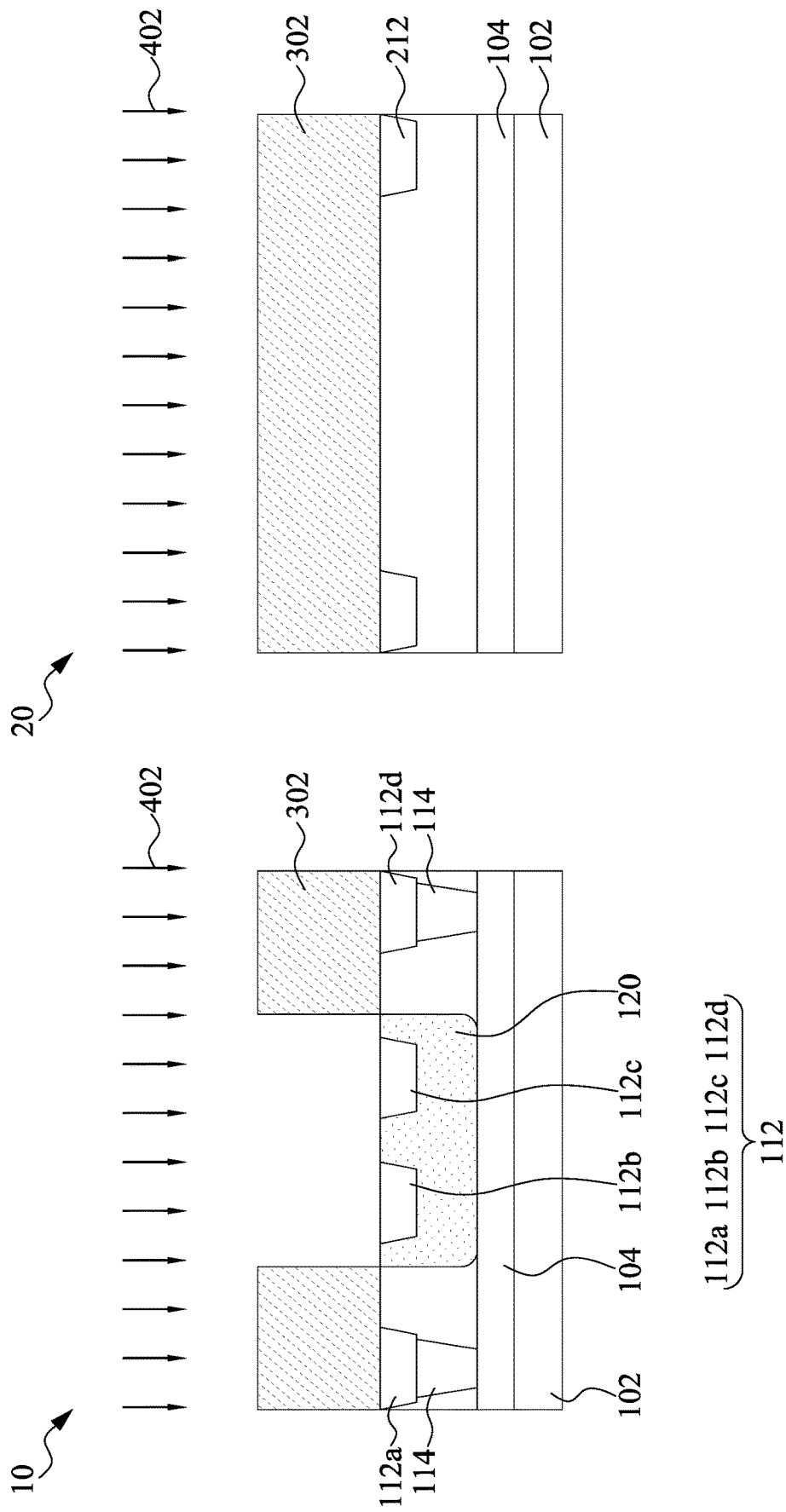

As shown in FIGS. 9A and 9B, a mask pattern 302 is formed on the regions 10 and 20. The mask pattern 302 includes optical sensitive material(s). For example, the mask pattern 302 includes photoresist or other suitable materials. The mask pattern 302 is configured to define a pattern of the HVNW or HVPW in the region 10. The mask pattern 302 may define an opening on the region 10. The mask pattern 302 may substantially completely cover the region 20. The opening of the mask pattern 302 may expose a portion of the substrate 102, the parts 112b and 112c. In some embodiment, an implant technique 402 is performed to form a well region 120 in the substrate 102 of the region 10. In some embodiment, the region 20 is not doped during performing the implant technique 402 due to the protection of the mask pattern 302.

As shown in FIGS. 10A and 10B, a mask pattern 304 is disposed on the regions 10 and 20. The mask pattern 304 includes optical sensitive material(s). For example, the mask pattern 304 includes photoresist or other suitable materials. The mask pattern 304 is configured to define a pattern of the shallow P-well (SHP) or shallow N-well (SHN), surrounding the well region 120, in the region 10. The mask pattern 304 defines openings on the region 10. The mask pattern 304 may substantially completely cover the region 20. The openings of the mask pattern 304 expose a portion of the substrate 102, a portion of the part 112a and a portion of the part 112d. In some embodiment, an implant technique 404 is performed to form doped regions 134-1 and 134-2 on two opposites of the well region 120. In some embodiment, the region 20 is not doped during performing the implant technique 404 due to the protection of the mask pattern 304.

Figures 11A, 11B:
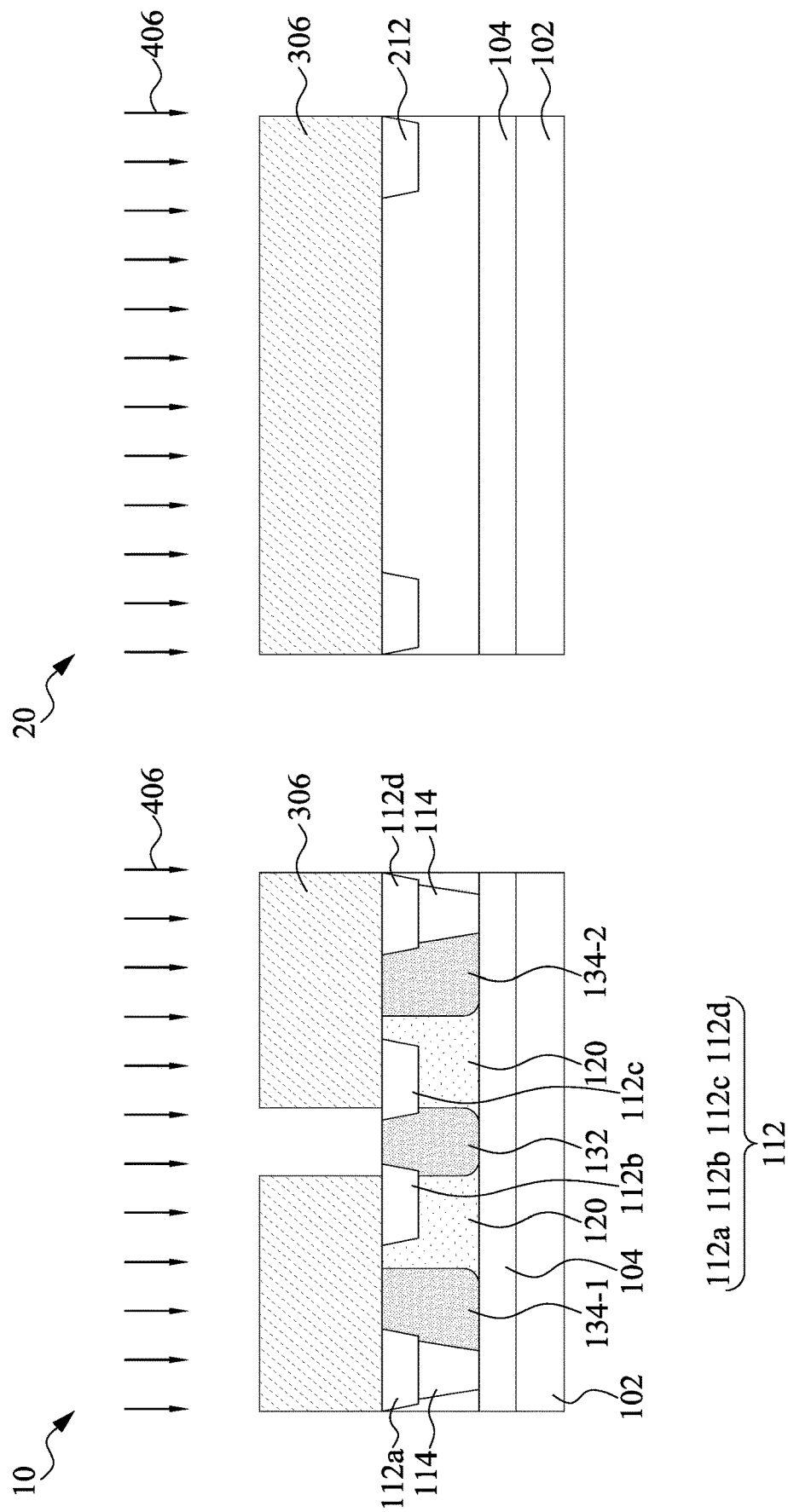

As shown in FIGS. 11A and 11B, a mask pattern 306 is disposed on the regions 10 and 20. The mask pattern 306 is configured to define a pattern of the shallow N-well (SHN) or shallow P-well (SHP) in the well region 120 of the region 10. The mask pattern 306 includes optical sensitive material(s). For example, the mask pattern 306 includes photoresist or other suitable materials. The mask pattern 306 defines an opening on the region 10. The mask pattern 306 may substantially completely cover the region 20. The opening of the mask pattern 306 expose the region located between the parts 112b and 112c of the isolation structure 112. An implant technique 406 is performed to form a doped region 132 in the well region 120. In some embodiment, the region 20 is not doped during performing the implant technique 406 due to the protection of the mask pattern 306.

As shown in FIGS. 12A and 12B, a mask pattern 308 is disposed on the regions 10 and 20. The mask pattern 308 is configured to define a pattern of the counter-doped regions in the region 10 and to define a pattern of the well region in the region 20. The mask pattern 308 includes optical sensitive material(s). For example, the mask pattern 308 includes photoresist or other suitable materials. In some embodiments, the mask pattern 308 exposes the region 10 and region 20. In some embodiments, the mask pattern 308 defines openings on the region 10. The openings of the mask pattern 308 expose the parts 112b and 112c of the isolation structure. An implant technique 408 is performed to form counter-doped regions 140a-1 and 140a-2 to cover the corners C1 of the parts 112b and 112c of the isolation structure 112 in the region 10. Further, a well region 220 is formed in the substrate 102 and under the isolation structures 212 of the region 20. Each of the well region 220 and the counter-doped regions 140a-1 and 140a-2 has the second conductive type. In some embodiments, one mask is used to define the pattern of the mask pattern 308 such that the counter-doped region 140a-1, counter-doped region 140a-2 and the well region 220 are formed in the same step.

Figure 13B:
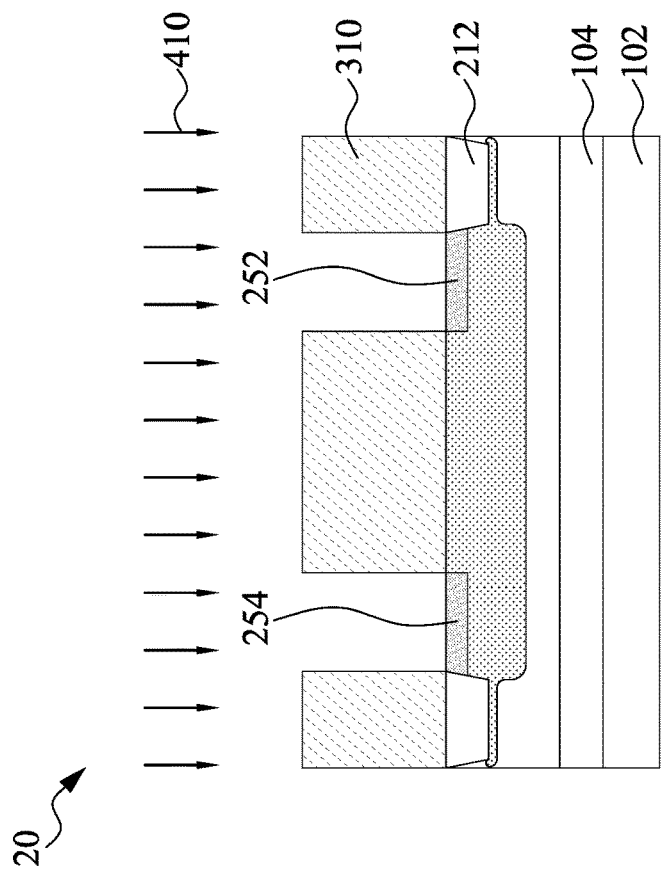
Figure 13A:
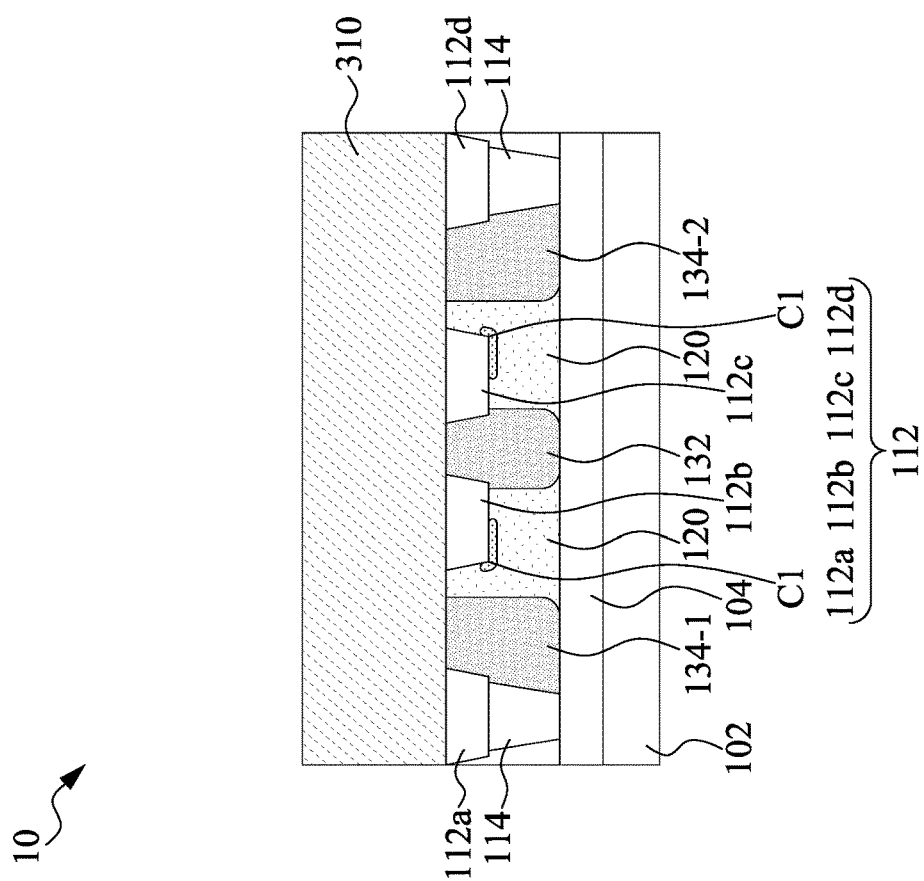

As shown in FIGS. 13A and 13B, a mask pattern 310 is disposed on the regions 10 and 20. The mask pattern 308 is configured to define a pattern of the source region and the drain region of the region 20. The mask pattern 310 includes optical sensitive material(s). For example, the mask pattern 310 includes photoresist or other suitable materials. The mask pattern 310 define openings on the region 20. The mask pattern 310 may substantially completely cover the region 10. An implant technique 410 is performed to form a doped region 252 (or source region) and a doped region 254 (or drain region) in the region 20. Each of the regions 252 and 254 has the first conductive type. In some embodiment, the region 10 is not doped during performing the implant technique 410 due to the protection of the mask pattern 310.

Figure 14A:
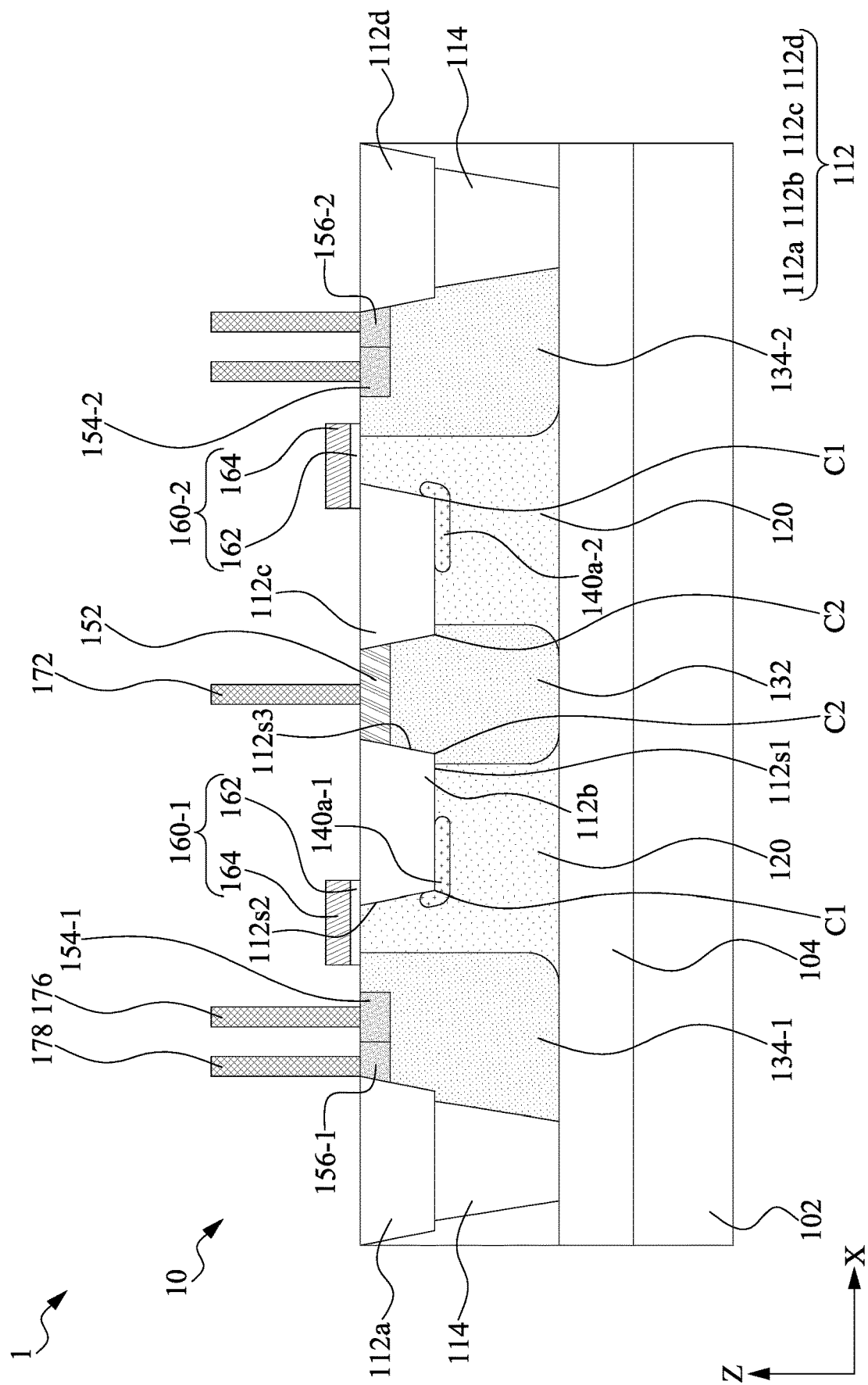
Figure 14B:
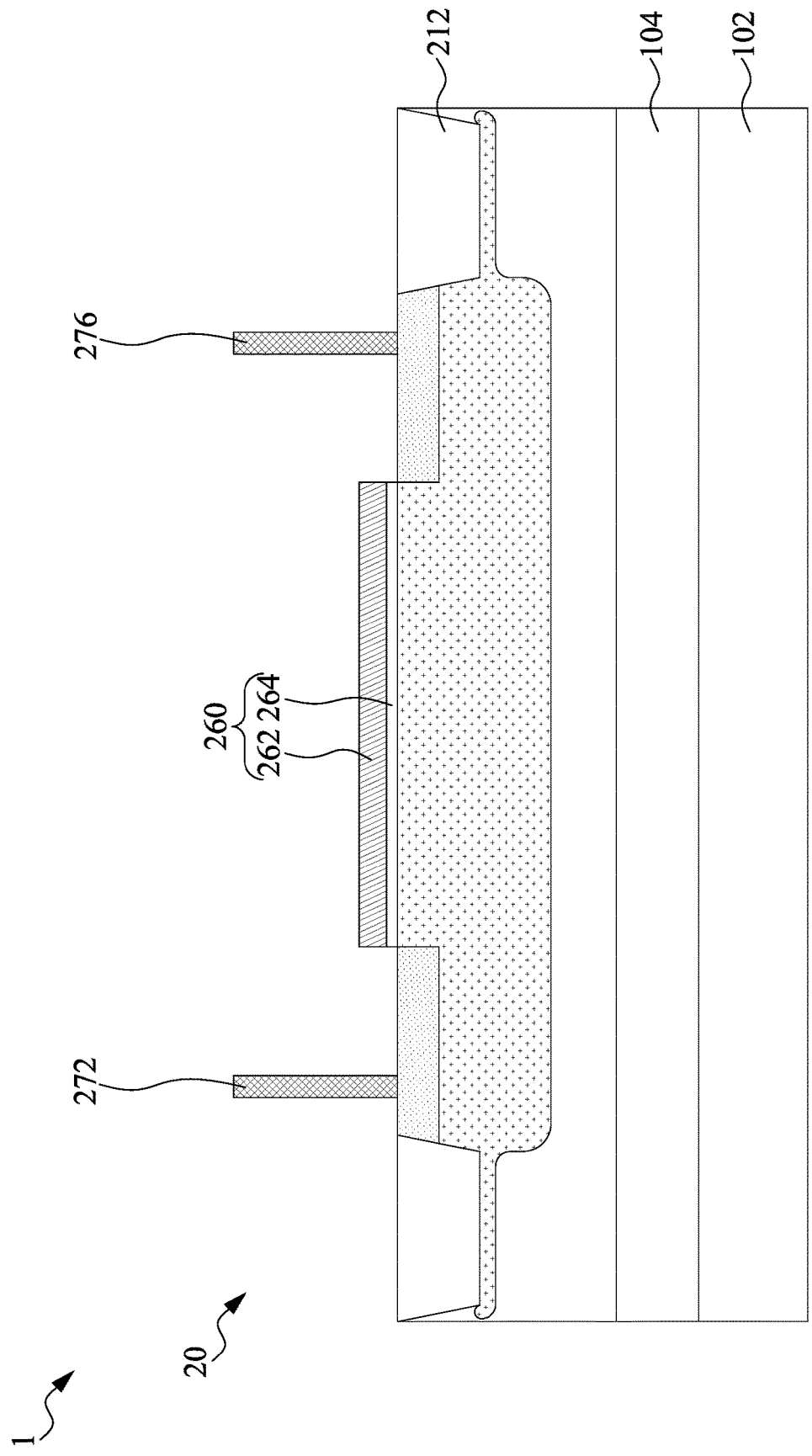

As shown in FIGS. 14A and 14B, doped regions 152, 154-1, 154-2, 156-1 and 156-2, gate structures 160-1 and 160-2 and electrical connectors 172, 176 and 178 are formed in the region 10. A gate structure 260, including a gate dielectric 262 and a gate electrode 264, and electrical conductors 272 and 276 are formed on the region 20. As a result, the semiconductor device 1 is created. The region 10 of the semiconductor device 1 may correspond to the semiconductor device 100a shown in FIG. 1B.

In this embodiment, the patterns of the counter-doped regions 140a-1 and 140a-2 of the region 10 and the well region 220 of the region 20 can be defined by one mask. Therefore, it does not require additional mask(s) to form the counter-doped regions 140a-1 and 140a-2. Further, the formation of the counter-doped regions 140a-1 and 140a-2 can reduce the HCI. As a result, the performance of the semiconductor device 1 is improved without additional cost.

Some embodiments of the present disclosure provide a semiconductor device. The semiconductor device includes a substrate and a first isolation structure in the substrate. The first isolation structure has a first corner. The semiconductor device also includes a first well region with a first conductive type. The semiconductor device includes further includes a gate structure over the first well region and covers a portion of the first corner of the first isolation structure. In addition, the semiconductor device includes a first doped region and a second doped region disposed on two opposites of the gate structure. Each of the first doped region and the second doped region has the first conductive type. The semiconductor device also includes a first counter-doped region in the first well region with a second conductive type different from the first conductive type. The first counter-doped region covers the first corner of the first isolation structure.

Some embodiments of the present disclosure provide a semiconductor device. The semiconductor device includes a substrate and a first isolation structure in the substrate. The first isolation structure has a first side. The semiconductor device also includes a first well region with a first conductive type. The semiconductor device further includes a gate structure over the first well region. The first well region covers the first side of the first isolation structure. In addition, the semiconductor device includes a first doped region and a second doped region disposed on two opposites of the gate structure. Each of the first doped region and the second doped region has the first conductive type. The semiconductor device also includes a first counter-doped region in the first well region with a second conductive type different from the first conductive type. Each of the first isolation structure, the gate structure and the first counter-doped region are overlapped with each other.

Some embodiments of the present disclosure provide a method of manufacturing a semiconductor device. The semiconductor device has a first region and a second region. The method includes: providing a substrate; forming a first isolation structure in the first region of the substrate, wherein the first isolation structure has a first corner; forming a first well region with a first conductive type in the first region of the substrate; and forming a second well region in the second region of the substrate and a first counter-doped region in the first well region to cover the first corner of the first isolation structure, wherein the second well region and the first counter-doped region have a second conductive type different from the first conductive type.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first isolation structure in the substrate, wherein the first isolation structure has a first corner;
   a first well region with a first conductive type;
   a gate structure over the first well region and covering the first corner of the first isolation structure;
   a first doped region and a second doped region disposed on two opposites of the gate structure, wherein each of the first doped region and the second doped region has the first conductive type;
   a first counter-doped region in the first well region with a second conductive type different from the first conductive type, wherein the first counter-doped region covers the first corner of the first isolation structure; and
   a second counter-doped region in the first well region with the second conductive type, wherein the second counter-doped region covers the first corner.

2. The semiconductor device of claim 1, wherein the first corner of the first isolation structure is separated from the first well region by the first counter-doped region to reduce electrons impacting the first corner of the first isolation structure.

3. The semiconductor device of claim 1, wherein the first isolation structure has a lateral surface and a bottom surface collectively defining the first corner of the first isolation structure, and the first counter-doped region is separated from the lateral surface.

4. The semiconductor device of claim 1, wherein the first isolation structure has a lateral surface and a bottom surface collectively defining the first corner of the first isolation structure, and the first counter-doped region is separated from the bottom surface.

5. The semiconductor device of claim 1, wherein the first isolation structure has a lateral surface and a bottom surface collectively defining the first corner of the first isolation structure, and the first counter-doped region is contact with the lateral surface and the bottom surface.

6. The semiconductor device of claim 1, wherein the first counter-doped region is separated from the first well region by the second counter-doped region.

7. The semiconductor device of claim 1, wherein the second counter-doped region is separated from a lateral surface of the first isolation structure.

8. The semiconductor device of claim 1, wherein a portion of the first counter-doped region is in contact with the first well region.

9. The semiconductor device of claim 1, further comprising:
   a third doped region with the first conductive type, wherein the first doped region is separated from the first well region by the third doped region, and the first counter-doped region is separated from the third doped region.

10. The semiconductor device of claim 9, further comprising:
    a fourth doped region with the second conductive type, wherein the second doped region is separated from the first well region by the fourth doped region, and the first counter-doped region is disposed between the third doped region and the fourth doped region.

11. A semiconductor device, comprising:
    a substrate;
    a first isolation structure in the substrate, wherein the first isolation structure has a first side;
    a first well region with a first conductive type;
    a gate structure over the first well region, wherein the first well region covers the first side of the first isolation structure;
    a first doped region and a second doped region disposed on two opposites of the gate structure, wherein each of the first doped region and the second doped region has the first conductive type;

a first counter-doped region in the first well region with a second conductive type different from the first conductive type, wherein each of the first isolation structure, the gate structure and the first counter-doped region overlaps with each other; and a second counter-doped region in the first well region with the second conductive type, wherein the second counter-doped region is in contact with a bottom surface and a lateral surface of the first isolation structure.

12. The semiconductor device of claim 11, wherein a portion of the first counter-doped region is free from overlapping the gate structure.

13. The semiconductor device of claim 11, wherein in a plain view, the first doped region is enclosed by a boundary of the gate structure.

14. The semiconductor device of claim 11,
wherein each of the first isolation structure, the gate structure, the first counter-doped region and the second counter-doped region are overlapped with each other.

15. The semiconductor device of claim 11, further comprising:
a third doped region with the first conductive type, wherein the third doped region overlaps the first doped region and the first isolation structure, and the first counter-doped region is separated from the third doped region.

16. A semiconductor device, comprising:
a substrate;
a well region disposed within the substrate and having a first conductive type;
an isolation structure disposed within the well region;
a first doped region disposed within the substrate, wherein the first doped region has the first conductive type and covers a first corner of the isolation structure;
a second doped region disposed within the substrate, wherein the second doped region has a second conductive type different from the first conductive type, and the second doped region is spaced apart from the isolation structure; and
a counter-doped region disposed within the well region and having the second conductive type, wherein the counter-doped region extends between the first doped region and the second doped region and proximal to a second corner of the isolation structure, and the counter-doped region has a first portion and a second portion with a doping concentration different from that of the first portion.

17. The semiconductor device of claim 16, wherein the counter-doped region is in contact with a bottom surface of the isolation structure.

18. The semiconductor device of claim 16, wherein the counter-doped region is in contact with a lateral surface of the isolation structure.

19. The semiconductor device of claim 16, further comprising:
a gate structure disposed over the substrate, wherein the gate structure covers the second doped region and the counter-doped region.

* * * * *